(12) United States Patent
Lao (10) Patent No.: US 9,287,162 B2
(45) Date of Patent: Mar. 15, 2016

(54) FORMING VIAS AND TRENCHES FOR SELF-ALIGNED CONTACTS IN A SEMICONDUCTOR STRUCTURE

(71) Applicants: SAMSUNG ELECTRONICS CO., LTD., Gyeonggi-Do (KR); Samsung Austin Semiconductor, L.P., Austin, TX (US)

(72) Inventor: Keith Quoc Lao, Austin, TX (US)

(73) Assignees: Samsung Austin Semiconductor, L.P., Austin, TX (US); Samsung Electronics Co., Ltd., Suwon-si (KR)

( * ) Notice: Subject to any disclaimer, the term of this patent is extended or adjusted under 35 U.S.C. 154(b) by 184 days.

(21) Appl. No.: 13/738,629

(22) Filed: Jan. 10, 2013

(65) Prior Publication Data

US 2014/0191409 A1    Jul. 10, 2014

(51) Int. Cl.

| | |
|---|---|
| *H01L 21/44* | (2006.01) |
| *H01L 21/768* | (2006.01) |
| *H01L 21/311* | (2006.01) |
| *H01L 23/522* | (2006.01) |
| *H01L 23/532* | (2006.01) |

(52) U.S. Cl.
CPC .... *H01L 21/76813* (2013.01); *H01L 21/31144* (2013.01); *H01L 21/76811* (2013.01); *H01L 23/5226* (2013.01); *H01L 23/53295* (2013.01); *H01L 2924/0002* (2013.01)

(58) Field of Classification Search
CPC ................... H01L 21/76877; H01L 23/49827
USPC ............................................ 438/667; 257/774
See application file for complete search history.

(56) References Cited

U.S. PATENT DOCUMENTS

| | | | |
|---|---|---|---|
| 6,774,024 B2 | 8/2004 | Miyamoto et al. | |
| 6,972,209 B2 | 12/2005 | Agarwala et al. | |
| 7,473,992 B2 | 1/2009 | Ogawa | |
| 7,557,034 B2 | 7/2009 | Hotta et al. | |
| 7,843,068 B2 | 11/2010 | Murayama et al. | |
| 8,090,983 B2 | 1/2012 | Weiberle et al. | |
| 2003/0119307 A1* | 6/2003 | Bekiaris et al. | 438/638 |
| 2003/0160331 A1 | 8/2003 | Fujisawa | |
| 2004/0245643 A1 | 12/2004 | Takewaki et al. | |

FOREIGN PATENT DOCUMENTS

| | | | |
|---|---|---|---|
| JP | 2004335914 A | 11/2004 |
| KR | 20000002910 A | 1/2000 |
| KR | 1020050067507 A | 7/2005 |
| KR | 100772254 B1 | 11/2007 |

* cited by examiner

*Primary Examiner* — Theresa T Doan

(57) ABSTRACT

A semiconductor structure is formed to include a non-conductive layer with at least one metal line, a first dielectric layer, a first stop layer, a second dielectric layer, a second stop layer, a third stop layer and a fourth stop layer. A first photoresist layer is formed over the upper stop layer to develop at least one via pattern. The structure is selectively etched to form the via pattern in the third stop layer through the fourth stop layer. The first photoresist layer is then removed. A second photoresist layer is formed over the upper stop layer to develop a plurality of trench patterns, each of the trench pattern comprising a via-trench portion in which the trench pattern is formed above the via pattern, and a trench portion that is remaining part of the trench pattern.

20 Claims, 7 Drawing Sheets

FORMING VIAS AND TRENCHES FOR SELF-ALIGNED CONTACTS IN A SEMICONDUCTOR STRUCTURE

TECHNICAL FIELD

The present disclosure relates to methods for forming vias and trenches facilitating electric contact between integrated circuit wirings in semiconductor structures.

BACKGROUND

A semiconductor structure comprising multiple layers includes trenches and openings extending from the trenches, where the openings formed through an insulating layer are typically referred to as vias. Vias are formed in accordance with a critical dimension associated with corresponding trenches in a circuit region of a semiconductor structure. A critical dimension to assure proper alignment between vias and trenches limits the density of the circuits on the semiconductor structure, and thus ultimately determines the area occupied by a particular semiconductor circuit or individual device.

There is, therefore, a need in the art for improvements in forming aligned trenches and vias in semiconductor structures.

SUMMARY

A semiconductor structure is formed to include a non-conductive layer with at least one metal line, a first dielectric layer formed over the non-conductive layer, a first stop layer formed over the first dielectric layer, a second dielectric layer formed over the first stop layer, a second stop layer formed over the second dielectric layer, a third stop layer formed over the second stop layer, and a fourth stop layer. A first photoresist layer is formed over the upper stop layer to develop at least one via pattern. The structure is etched to form the via pattern in the third stop layer through the fourth stop layer. The first photoresist layer is then removed. A second photoresist layer is formed over the upper stop layer to develop a plurality of trench patterns, wherein the trench pattern comprises a via-trench portion in which the trench pattern is formed above the via pattern, and a trench portion that is the remaining part of the trench pattern. The structure is then etched until all of the via-trench portions reach the metal line. The via-trench portions and the trench portions are filled with conductive material. The second, third and fourth stop layers and the second photoresist layer are removed.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 12, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged semiconductor devices.

Figure 1A:
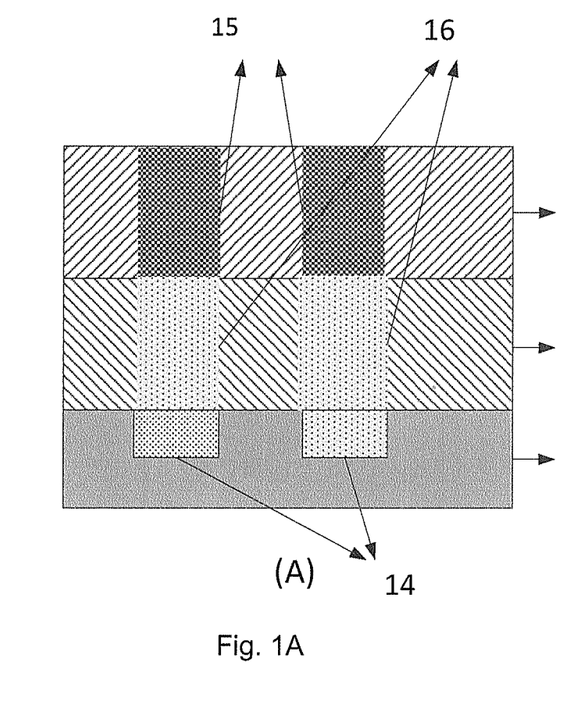
FIG. 1A is a cross-sectional view of a semiconductor structure with aligned vias and trenches.
Figure 1B:
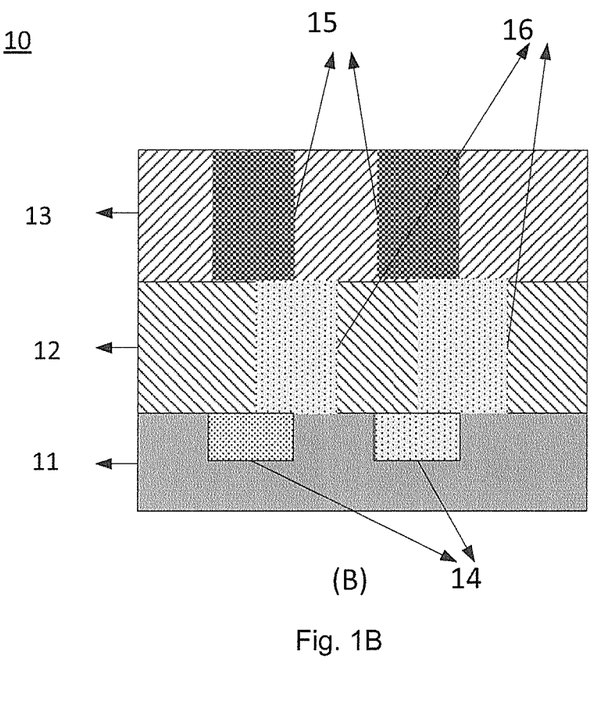
FIG. 1B is a cross-sectional view of the semiconductor structure with misaligned vias and trenches.

Two conductive layers of a semiconductor structure may be electrically connected in a number of ways, one of which is referred to as the dual damascene process. FIG. 1A illustrates a semiconductor structure with aligned vias and trenches according to the dual damascene process, and FIG. 1B illustrates a semiconductor structure with misaligned vias and trenches. The semiconductor structure 10 includes a non-conductive layer 11 with two metal lines 14, a first dielectric layer 12 formed on the non-conductive layer 11, and a second dielectric layer 13 formed on the first dielectric layer 12.

The dual damascene process creates vias 16 in contact with the metal lines 14 through the first dielectric layer 12, and then creates trenches 15 through the second dielectric layer 15. In the dual damascene process, alignment of the vias with both with metal lines and with trenches in accordance with the critical dimension (CD) specification is required. However, as the density of circuits formed in a semiconductor structure increases, misalignment also tends to increase, resulting in poorer production yield.

FIGS. 2A-2B, 3A-3B, 4A-4B, 5A-5B, 6A-6C, 7A-7C, 8A-8C, 9A-9C, 10A-10C and 11A-11C illustrate the processes for forming aligned vias and trenches in a semiconductor structure according to one or more exemplary embodiments of the present disclosure. Each figure comprises a top view (A), a cross-sectional view (B) taken at section line A-A', and, when applicable, a cross-sectional view (C) taken at section line B-B'. While the processes herein are illustrated and described below as a series of acts or events, it will be appreciated that the present disclosure is not limited by the illustrated ordering of such acts or events. For example, some acts may occur in different orders and/or concurrently with other acts or events apart from those illustrated and/or described herein, in accordance with disclosure. In addition, not all illustrated steps may be required to implement a methodology in accordance with the present disclosure.

Figures 2A, 2B, 3A, 3B:
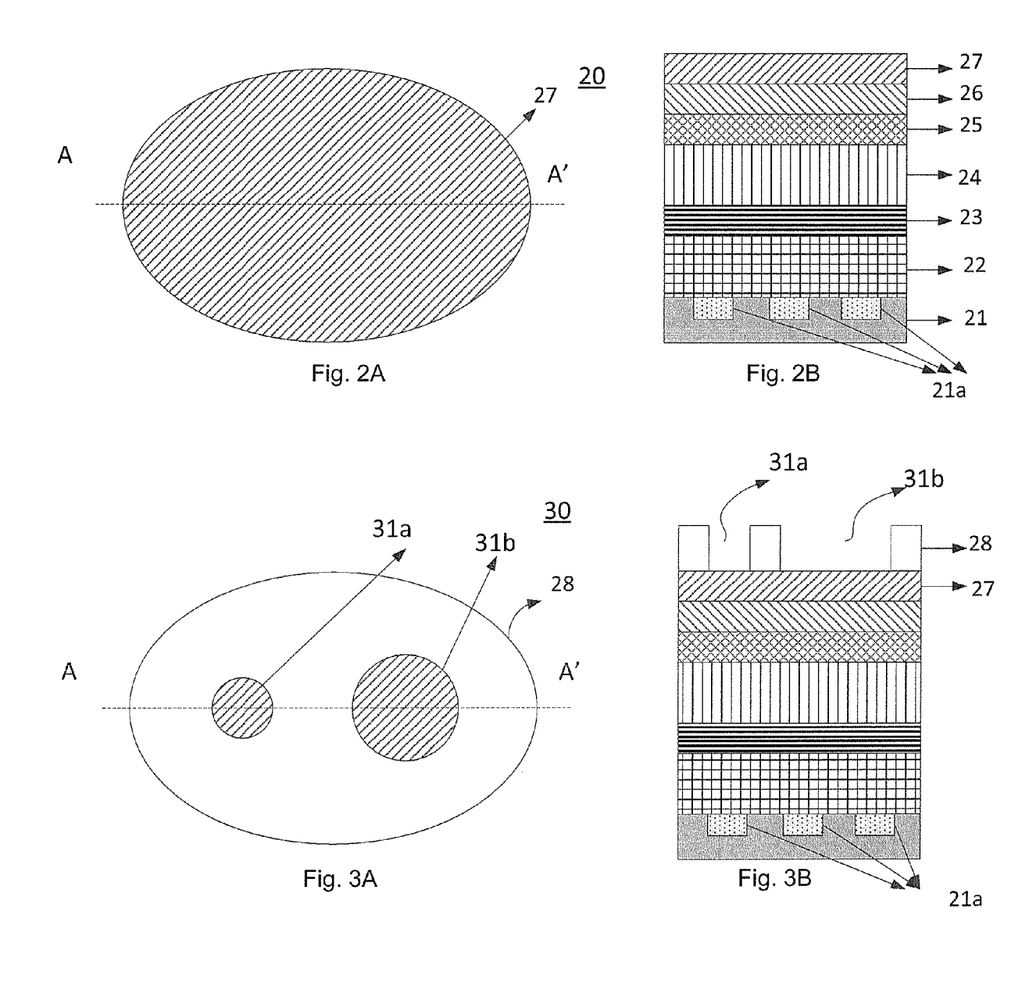
FIGS. 2A-2B, 3A-3B, 4A-4B, 5A-5B, 6A-6C, 7A-7C, 8A-8C, 9A-9C, 10A-10C and 11A-11C illustrate the processes for forming trenches and vias in a semiconductor structure according to one or more embodiments of the present disclosure.

FIG. 2A is a top view of a semiconductor structure according to one embodiment of the present disclosure, and FIG. 2B is a partial cross-sectional view along the dotted section line A-A' in FIG. 2A. In this embodiment, the structure 20 includes a non-conductive layer 21 with three metal lines 21a, a first inter-level dielectric (ILD) 22 formed on the non-conductive layer 21, a first stop layer 23 formed on the first ILD layer 22, a second ILD 24 formed on the first stop layer 23, a second stop layer 25 formed on the second ILD layer 24, a third stop layer 26 formed on the second stop layer 25 and a fourth stop layer 27 formed on the third stop layer 26. The metal lines can be formed from any suitable conductive material, such as copper or aluminum. The ILD layers can comprise one or more low-K dielectric materials. Also, each stop layer acts as an etchant stop to prevent etching into the underlying layer.

Subsequently, a photoresist layer is disposed on the surface of the structure. The photoresist layer is then exposed to light of an appropriate wavelength using a mask that exposes one or more via patterns on the photoresist layer. The photoresist layer is developed to form the one or more via patterns on the photoresist layer. In some embodiments, the size of via pattern can be up to five times larger than that of the corresponding via that will be formed in the first ILD layer by the via pattern. Thus, the possible misalignment of vias with metal lines and with trenches can be prevented as described below.

As illustrated in FIGS. 3A and 3B, the photoresist layer 28 disposed on the fourth layer 27 is developed and then selectively etched to leave hard masks forming two via patterns 31a and 31b in between. The size of the first via pattern 31a is large enough for one trench pattern to be formed thereon in widthwise direction, and the size of the second via pattern 31b is large enough for two trench patterns to be formed thereon in widthwise direction. While the via pattern is of shape of a circle in the exemplary embodiment, various shapes of via patterns, such as rectangular and oval, may be implemented without departing from the scope of the present disclosure.

Figure 4A:
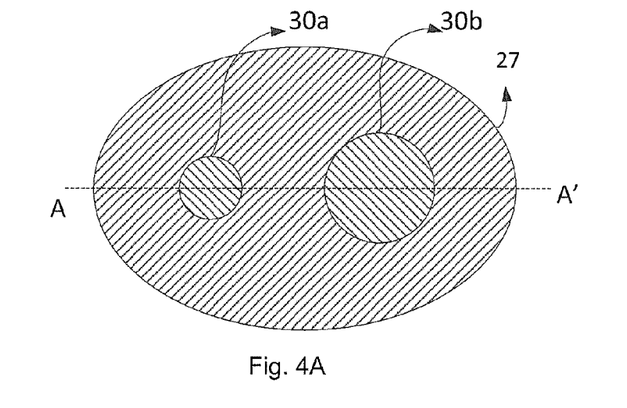
Figure 4B:
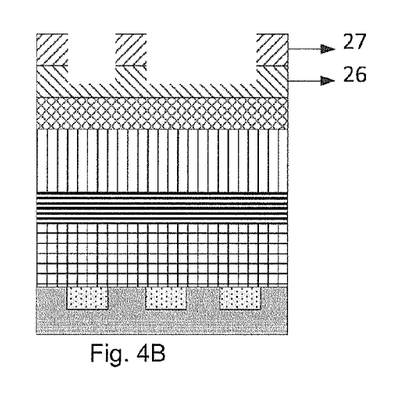

After forming the via patterns in the third stop layer through the fourth stop layer 27 by etching the structure, the hard masks of photoresist layer 28 are stripped away, exposing the via patterns 30a and 30b as illustrated in FIGS. 4A and 4B.

Figure 5A:
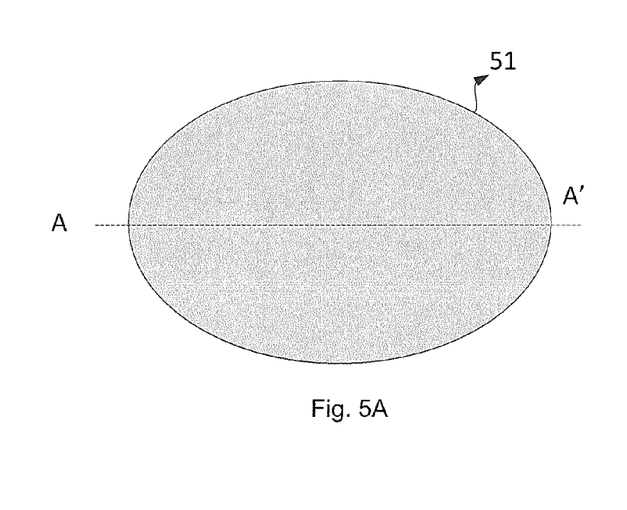
Figure 5B:
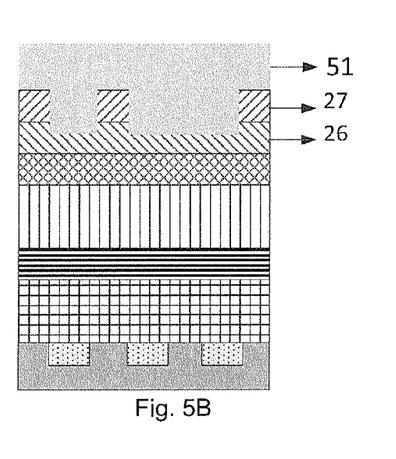

Another photoresist layer 51 is disposed again on the surface of the structure 50 as illustrated in FIGS. 5A and 5B. Subsequently, the photoresist layer 51 is patterned, exposed and developed as described above to form one or more trench patterns. The trench patterns are substantially identical to the corresponding trenches that will be formed in the second ILD layer beneath the trench patterns. Thus, the width of a trench pattern, rather than that of an oversize via pattern, determines the width of a via-trench and a trench.

Figure 6A:
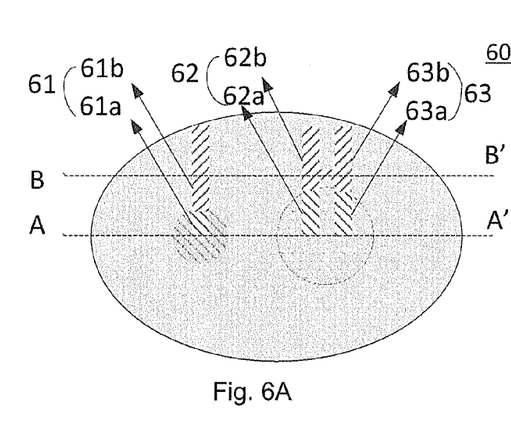
Figure 6B:
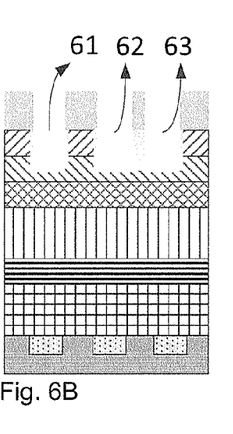
Figure 6C:
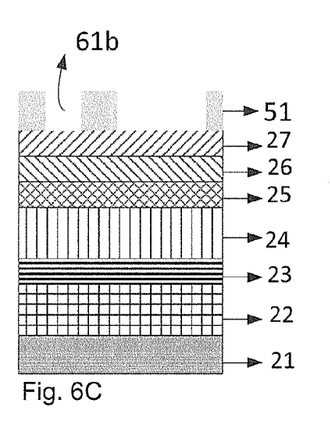

FIGS. 6A, 6B and 6C illustrate the structure 60 in which the trench patterns are formed after the photoresist layer is etched. FIG. 6C illustrates the cross-sectional view along the dotted section line B-B' in FIG. 6A. The second photoresist layer 51 disposed on the fourth layer 27 is developed and then etched selectively to leave masks to form three trench patterns 61, 62 and 63 in between.

The trench patterns are formed in part over the via patterns which have been formed in the third stop layer 26 through the fourth stop layer 27. The first trench pattern 61 is formed over the first via pattern 30a, and two trench patterns 61 and 62 are formed over the second via pattern 30b.

The portion in which a trench pattern formed over the via pattern is referred to as a "via-trench portion" in the present disclosure, while the part in which only the trench pattern is formed is referred as a "trench portion" herein. The trench patterns 61, 62 and 63 comprise the via-trench portions 61a, 62a and 63a, respectively, and the trench portion 61b, 62b and 63b, respectively. One end of the via-trench portion 61a is formed over the first via pattern 30a, and one end of each of the trench portions 62a and 63a is formed over the second trench patterns 30b.

A via-trench portion functions as both a trench recess and for a via hole. Because a via portion has been formed in a deeper layer than a trench portion, a via-trench portion is also formed in a deeper layer than a trench portion. For the same reason, during etching the structure, a via-trench portion is etched deeper than a trench portion.

Figure 7A:
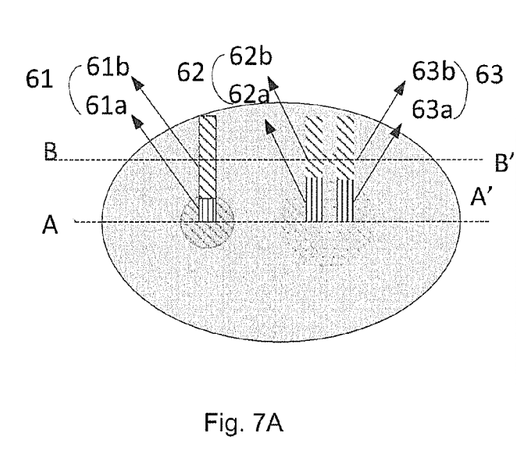
Figure 7B:
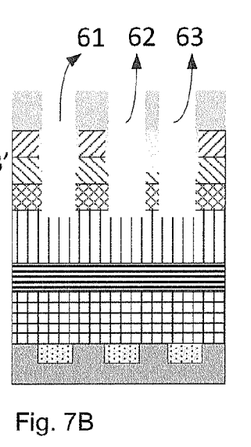
Figure 7C:
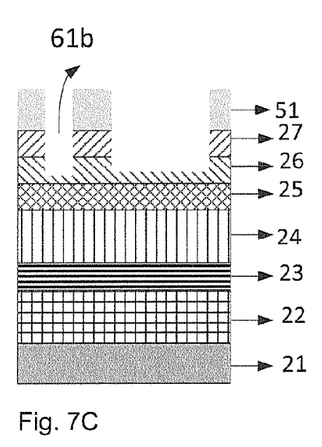

As the etching process continues, the via-trench portions 61a, 62a and 63a extend through the first stop layer 25 to the second ILD layer 24 and simultaneously, the trench portions 61b, 62b and 63b extend through the fourth stop layer 27 to the third stop layer 26 as illustrated in FIGS. 7A, 7B and 7C. In some embodiments, one or more different etch processes or etch chemistries can be used. For instance, a separate anisotropic etch process can be performed to etch trenches every different layers.

Figure 8A:
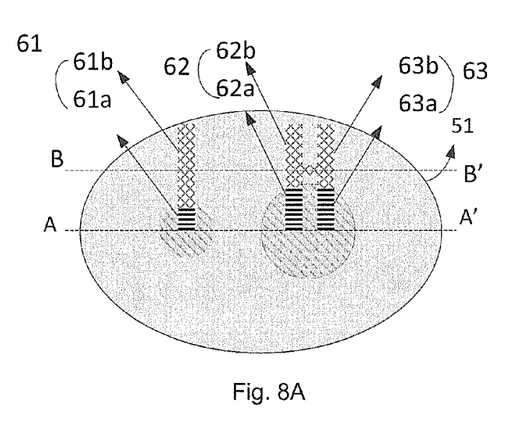
Figure 8B:
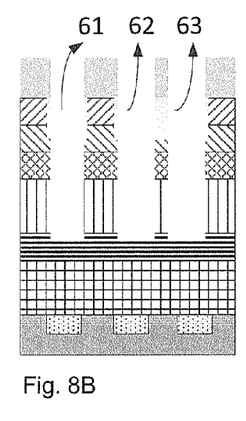
Figure 8C:
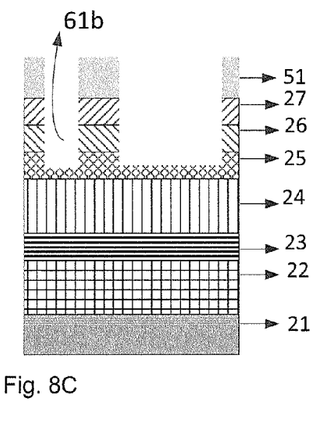

The etching process further continues to extend the via-trench portions 61a, 62a and 63a through the second ILD layer 24 to the first stop layer 23, and simultaneously extend the trench portions 61b, 62b and 63b through the third stop layer 26 to the second stop layer 25 as illustrated in FIGS. 8A, 8B and 8C.

Figure 9A:
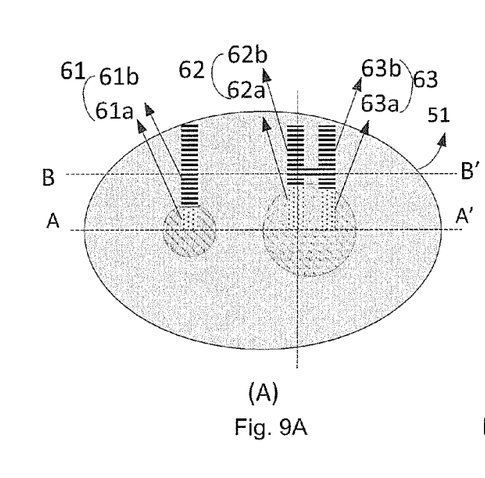
Figure 9B:
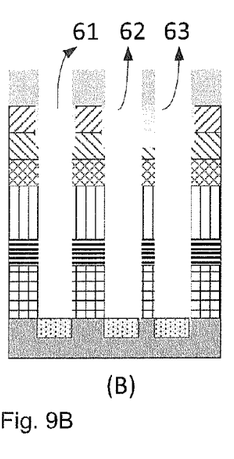
Figure 9C:
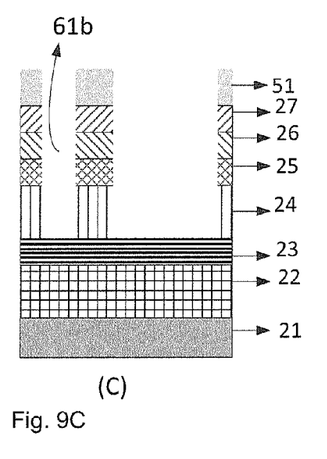

In the final stage of the etching process, the via-trench portions 61a, 62a and 63a reach the metal lines 21a through the first ILD layer 24, and the trench portions 61b, 62b and 63b are formed in the second ILD layer and stop at the first stop layer 24 as illustrated in FIGS. 9A, 9B and 9C.

Figure 10A:
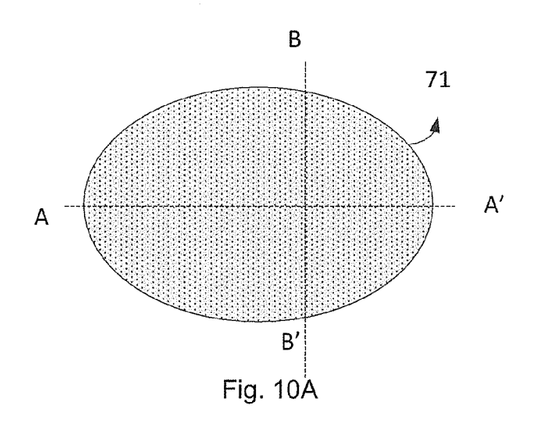
Figure 10B:
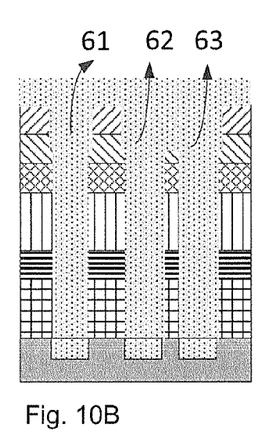
Figure 10C:
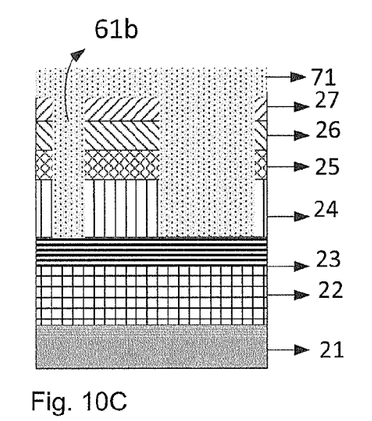
Figure 11A:
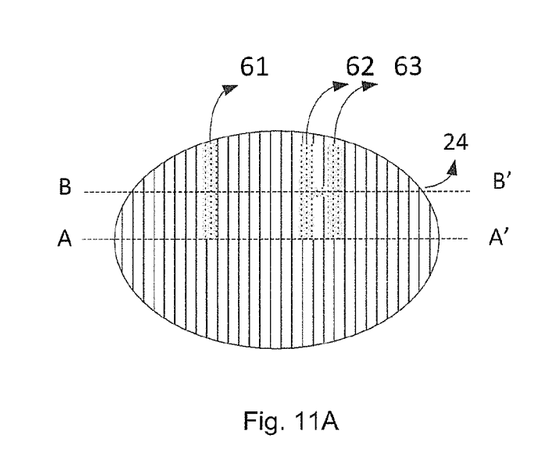
Figure 11B:
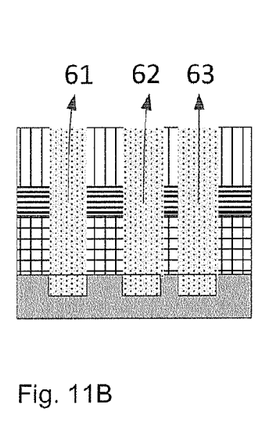
Figure 11C:
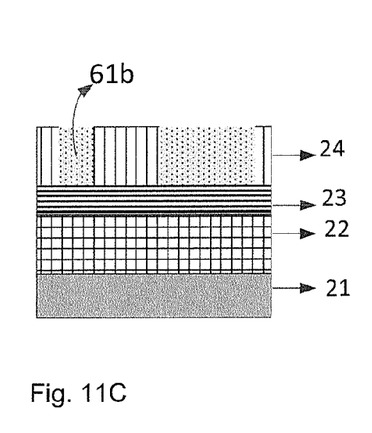

In some embodiments, the remaining photoresist layer 51 is stripped away and the via-trench portions and the trench portions are then filled with conductive material such as copper or aluminum as illustrated in FIGS. 10A, 10B and 10C. The via-trench portions 61a, 62a and 63a are filled with conductive material 71 electrically connecting the metal lines 21a and the trenches 61b, 62b and 63b. After the via-trench and trench portions have been filled with conductive material, the excessive layers such as the second, third and fourth stop layers 25, 26 and 27 are removed by, for example, chemical-mechanical polish (CMP) as illustrated in FIGS. 11A, 11B and 11C.

Figure 12:
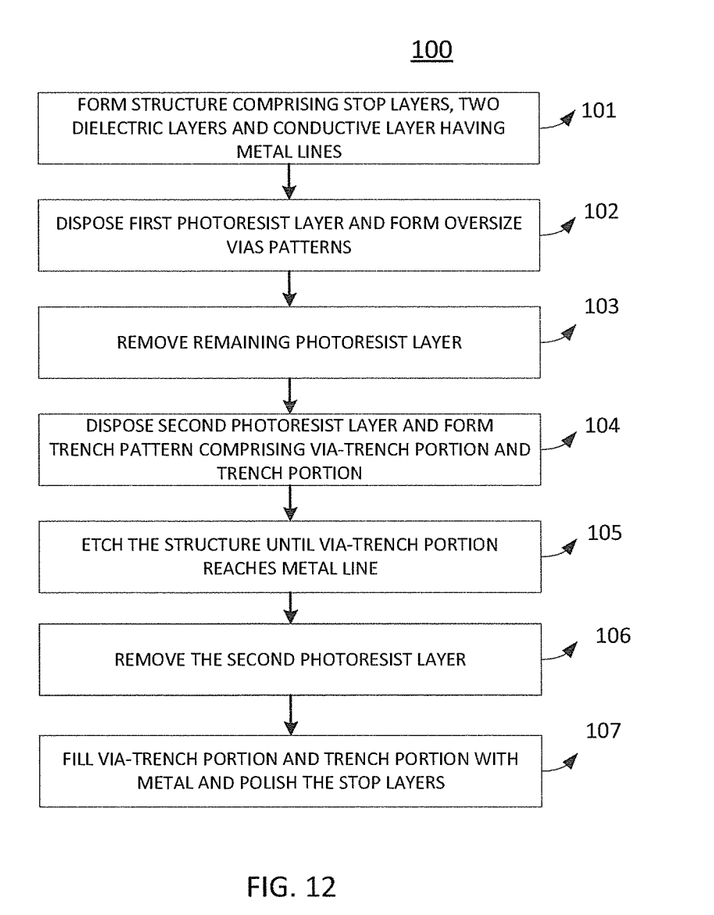
FIG. 12 is a high level flow chart illustrating a process for forming trenches and vias in a semiconductor structure according to one embodiment of the present disclosure.

FIG. 12 is a high level flow chart illustrating a process for forming vias and trenches in a semiconductor structure according to one embodiment of the present disclosure. While the flow chart depicts a series of sequential steps, unless explicitly stated no inference should be drawn from that sequence regarding specific order of performance, performance of steps or portions thereof serially rather than concurrently or in an overlapping manner, or performance of the steps depicted exclusively without the occurrence of intervening or intermediate steps. Moreover, those skilled in the art will recognize that a complete process of fabricating semiconductor devices is not illustrated or described. Instead, for simplicity and clarity, only so much of the fabrication process as is unique to the present disclosure or necessary for an understanding of the present disclosure is depicted and described.

The process 100 begins with forming a structure including a non-conductive layer with at least one metal line, a first dielectric layer formed over the non-conductive layer, a first stop layer formed over the first dielectric layer, a second dielectric layer formed over the first stop layer and an upper stop layer formed over the second dielectric layer (step 101). In some embodiments, the upper stop layer comprises at least one sub stop layer up to four sub-stop layers.

Subsequently, the first photoresist layer is disposed on the surface of the structure. The first photoresist layer is then exposed to light of an appropriate wavelength using a mask and developed to form one or more oversize via patterns. The photoresist layer is then selectively etched to leave masks to form via patterns in the upper stop layer (step 102).

The remaining photoresist layer is stripped away after the etching is complete (step 103).

The second photoresist layer is disposed on the surface of the structure. The second photoresist layer is then patterned, exposed and developed as described above to form one or more trench patterns. A trench pattern comprises a via-trench pattern portion and a trench portion (step 104).

The second photoresist layer is selectively etched to form the via-trench portions and the trench portions. As the etching process continues, the via-trench portions extend through the stop layers and the first and second ILD layers to metal lines and simultaneously, the trench portions extend through the stop layers and the second ILD layers to the first ILD layers (step 105).

After the etching process is complete, the second photoresist layer is stripped away (step 106). In some embodiments, the second photoresist layer can be removed together when the upper stop layer is removed at step 107.

The via-trench portions and the trench portions are then filled with electrically conductive material such as copper or aluminum. Finally, the excessive layers including the upper stop layer are removed by, for example, chemical-mechanical polish (CMP) (step 107).

The methods according to the present disclosure provide the following advantages: reducing or eliminating reworking wafer due to misalignment; improving the device performance by low contact resistance; providing higher yield on wafer edge due to the aligned structure and reduction of complexity and process steps; allowing smaller circuit design; and saving cost due to the process integration (deposit multi layers of dielectric films with stop layer in between), potential higher yield (or, more die per wafer) and using lower cost scanner.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method to form trenches and vias in a semiconductor structure, the method comprising:
    forming a structure including a non-conductive layer with at least one metal line, a first dielectric layer formed over the non-conductive layer, a first etch stop layer formed over the first dielectric layer, a second dielectric layer formed over the first etch stop layer, and an upper etch stop layer formed over the second dielectric layer;
    forming a first photoresist layer over the upper etch stop layer to develop at least one via pattern;
    patterning the first photoresist layer selectively to form the at least one via pattern in the upper stop layer;
    removing the first photoresist layer;
    forming a second photoresist layer over the upper etch stop layer to develop at least one trench pattern, the trench pattern comprising a via-trench portion in which the trench pattern is formed above the via pattern and a trench portion that is a remaining part of the trench pattern other than the via-trench portion; and
    etching the structure until the via-trench portion reaches the metal line in the non-conductive layer.

2. The method of claim 1, wherein a size of the via pattern is larger than a size of a corresponding via that will be formed in the first dielectric layer.

3. The method of claim 2, wherein the size of the via pattern is up to five times larger than the corresponding via that will be formed in the first dielectric layer.

4. The method of claim 2, wherein a plurality of the trench patterns are formed in part above one via pattern.

5. The method of claim 1, wherein a width of the trench pattern determines a width of a via-trench and a trench.

6. The method of claim 1, wherein the trench portion is formed in the second dielectric layer.

7. The method of claim 1, wherein the via-trench portion and the trench portion are simultaneously etched during the etching process.

8. The method of claim 1, wherein the upper etch stop layer has at least one sublayer and as many as four stop sublayers.

9. The method of claim 1, wherein the upper etch stop layer comprises a second etch stop layer formed over the second dielectric layer, a third stop layer formed over the second etch stop layer and a fourth etch stop layer, and wherein the at least one via pattern is formed in the third etch stop layer through the fourth etch stop layer.

10. The method of claim 9, wherein the via-trench portion is etched to reach the first etch stop layer when the trench portion is etched to reach the second etch stop layer.

11. The method of claim 10, wherein the via-trench portion reaches the metal line when the trench portion reaches the first etch stop layer.

12. The method of claim 1, further comprising:
    filling the via-trench portion and the trench portion with conductive material; and
    removing the upper etch stop layer and the second photoresist layer.

13. A method to form trenches and vias in a semiconductor structure, the method comprising:
    forming a structure including a non-conductive layer with at least one metal line, a first dielectric layer formed over the non-conductive layer, a first etch stop layer formed over the first dielectric layer, a second dielectric layer formed over the first etch stop layer, and an upper etch stop layer formed over the second dielectric layer;
    forming a first photoresist layer over the upper etch stop layer to develop at least one via pattern;
    patterning the first photoresist layer selectively to form the via pattern in the upper etch stop layer;
    removing the first photoresist layer;
    forming a second photoresist layer over the upper etch stop layer to develop a plurality of trench patterns, the trench pattern comprising a via-trench portion in which the trench pattern is formed above the via pattern and a trench portion that is a remaining part of the trench pattern other than the via-trench portion;
    etching the structure until all of the via-trench portions reach the metal line;
    filling the via-trench portions and the trench portions with conductive material; and
    removing the upper etch stop layer and the second photoresist layer.

14. The method of claim 13, wherein a size of the via pattern is larger than a size of a corresponding via that will be formed in the first dielectric layer.

15. The method of claim 13, wherein the size of the via pattern is up to five times larger than the corresponding via that will be formed in the first dielectric layer.

16. The method of claim 13, wherein a plurality of the trench patterns are formed in part above one via pattern.

17. The method of claim 13, wherein a width of the trench pattern determines a width of a via-trench and a trench.

18. The method of claim 13, wherein the trench portion is formed in the second dielectric layer.

19. The method of claim 13, wherein the via-trench portion and the trench portion are simultaneously etched during the etching process.

20. The method of claim 13, wherein the upper etch stop layer has at least one sublayer and as many as four stop sublayers.

\* \* \* \* \*